United States Patent [19]

Katoh et al.

[11] Patent Number: 5,028,953
[45] Date of Patent: Jul. 2, 1991

[54] IMAGE FORMING APPARATUS HAVING SHEET FEEDING CONDITION DETECTING MEANS

[75] Inventors: Atsunori Katoh; Kenji Sakakibara, both of Ichinomiya; Ken Izaki; Michitoshi Akao, both of Nagoya; Hiroshi Morisaki, Nishikasugai; Naoyuki Hatta, Gamagori, all of Japan

[73] Assignee: Brother Kogyo Kabushiki Kaisha, Nagoya, Japan

[21] Appl. No.: 472,179

[22] Filed: Jan. 30, 1990

[30] Foreign Application Priority Data

| Jan. 30, 1989 | [JP] | Japan | 1-20403 |
| Jan. 31, 1989 | [JP] | Japan | 1-21764 |
| Jan. 31, 1989 | [JP] | Japan | 1-21765 |

[51] Int. Cl.⁵ .................. G03B 27/32; G03B 27/52; G03G 21/00
[52] U.S. Cl. .................. 355/27; 355/205
[58] Field of Search ............. 355/27, 50, 24, 204–209, 355/308

[56] References Cited

U.S. PATENT DOCUMENTS

| 4,536,079 | 8/1985 | Lippolis et al. | 355/206 |
| 4,860,058 | 8/1989 | Kobayashi et al. | 355/27 |
| 4,935,769 | 6/1990 | Ogura | 355/27 |

FOREIGN PATENT DOCUMENTS 0261509 3/1988 European Pat. Off. .
0281105 9/1988 European Pat. Off. .
2611390 9/1988 France .

OTHER PUBLICATIONS

2244 Research Disclosure (1988) Oct., No. 294, New York, NY, U.S.A., pp. 758–762–System for Registering to a Moving Web.

Primary Examiner—Richard A. Wintercorn
Attorney, Agent, or Firm—Oliff & Berridge

[57] ABSTRACT

An image forming apparatus for performing an exposure process of exposing a microcapsule sheet to light and performing a pressure-developing process of contacting the microcapsule sheet having the latent image thereon with a developer sheet under pressure, thereby to form a visible image on the developer sheet, comprises plural sheet feed rollers for feeding the microcapsule sheet from the sheet feed-out side of the microcapsule sheet to and along a sheet feed path and winding up the microcapsule sheet to thereby perform a sheet feeding operation, an optical sensor or lever sensor provided in the neighboring of the sheet feed-out side of the microcapsule sheet for detecting a sheet feeding condition, such as a residue of the microcapsule sheet, a sheet feed error, a sheet feed speed and so on in the sheet feeding operation and outputting a detection signal indicative of a detection result and a control unit for beforehand storing distance data on the sheet feed path of the latent image forming medium between the sensor and a pressure-developing unit and/or storing data on a sheet feeding condition of the microcapsule sheet based on the detection signal.

17 Claims, 9 Drawing Sheets

IMAGE FORMING APPARATUS HAVING SHEET FEEDING CONDITION DETECTING MEANS

BACKGROUND OF THE INVENTION

This invention relates to an image forming apparatus, and more particularly to an image forming apparatus having sheet feeding condition detecting means for detecting sheet feeding conditions of various operations for a sheet feeding process such as a sheet leading operation to a sheet feed path, a sheet feeding operation along the sheet path, a sheet residue detecting opration in the sheet feeding process to perform a full-color copying operation without a sheet feed error and an imaging error.

An image forming apparatus for forming a full-color image on a photosensitive recording medium such as a microcapsule sheet is generally constructed to operate as follows: An original is sandwiched between an original stand cover and an original stand glass which are reciprocally linearly movable on a top portion of the image forming apparatus. The original is illuminated with light emitted from a light source which comprises a halogen lamp and a semicylindrical reflecting mirror, and the original stand cover and the original stand glass are moved, thereby scanning the original with the light. The light which has scanned the original is led through optical systems to an exposure stand that is located centrally in the image forming apparatus. The light is irradiated onto one surface of an elongated band-like microcapsule sheet supplied to the exposure stand, so that a latent image is formed on the microcapsule sheet. The microcapsule sheet having the latent image formed thereon is then pressed against a developer sheet in a pressure-developing unit, thereby to form a visible image on the developer sheet. The visible image formed on the developer sheet is then fixed thereto by a heat-fixing unit, after which the developer sheet is discharged from the image forming apparatus.

In the above conventional image forming apparatus, when the residual quantity of the microcapsule sheet wound around a cartridge shaft for supplying the microcapsule sheet to the exposure stand, the pressure-developing unit and other elements for performing a series of image forming processes becomes zero in a sheet feeding process, only a developer sheet having a developer agent thereon would be supplied to the pressure-developing unit, and therefore the developer agent coated on the developer sheet is directly contacted with a pressure roller of the pressure-develping unit. Accordingly, the following disadvantages may occur in the conventional image forming apparatus: the pressure roller is soiled by the developer sheet, and a sheet jam of the developer sheet occurs because the tension applied to the microcapsule sheet is lost due to separation of the trailing end portion of the microcapsule sheet from the cartridge shaft and the developer sheet is not forcedly guided to an inlet of the pressure-developing unit by the microcapsule sheet. Therefore, it is required to cease a pressure-developing process and wind up the unexposed residual microcapsule sheet at the time when the residual quantity of the microcapsule sheet wound around the cartridge shaft becomes zero. However, when the pressure-developing process is ceased halfway, it more frequently occurs that only a part of the original image is formed on the developer sheet, that is, a complete copied image can not be formed on the microcapsule sheet, and this is a waste of the developer sheet.

Further, in the above conventional image forming apparatus, when there is no residual microcapsule sheet wound around the cartridge shaft, it is necessary to exchange an used cassette having no microcapsule sheet for a new one having an unused (unexposed) microcapsule sheet and exchange the take-up shaft for winding up the used (exposed) microcapsule sheet is also exchanged for a new one. In this case, it is required to carry out a sheet feeding operation in which the leading end of an unused microcapsule sheet is lead to a sheet feed path and fed through a sheet feed path to wind up the leading end around the new take-up shaft. This winding operation of the leading end of the microcapsule sheet around the take-up shaft is performed as follows.

The leading end of the microcapsule sheet is automatically led through the sheet feed path provided inside of the image forming apparatus, and then is automatically fed along the sheet feed path by a predetermined amount (distance) required for winding the leading end around the take-up shaft. During the above winding operation, the operator observes the sheet feed condition to check for sheet feed error, that is, the sheet feed error is detected by the operator's observing the feed. When the sheet feed error is observed by the operator, the microcapsule sheet is removed from the sheet feed path of the image forming apparatus, and then the sheet feeding operation is resumed.

As described above, in the conventional image forming apparatus, the sheet feed error is detected after the microcapsule sheet is fed through the sheet feed path by the predetermined amount (distance) required for winding the microcapsule sheet around the take-up shaft. However, in this sheet feed error detection manner as described above, if the microcapsule sheet erroneously wanders into a different feed path from the predetermined sheet feed path during the sheet feeding operation or there occurs a sheet feed error in which the microcapsule sheet is wound up by another roller, it requires more time and labor for restoring the troubled microcapsule sheet because such an error is not detected at an early stage of the sheet feeding operation. Further, when there occurs an error in which the leading end of the microcapsule sheet is not drawn out of the cassette, the error is not detected until the time which is required for winding the microcapsule sheet around the take-up shaft has elapsed. This is a waste of time as well as troublesome.

SUMMARY OF THE INVENTION

An object of this invention is to provide an image forming apparatus capable of preventing the elements constituting the image forming apparatus such as a pressure roller of the pressure-developing unit from being soiled, preventing a sheet jam of a visible image forming medium and preventing a halfway copied image from being formed on the visible image forming medium (that is, an imaging error) when the residual quantity of an latent image forming medium such a microcapsule sheet wound round the cartridge shaft becomes zero.

Another object of this invention is to provide an image forming apparatus in which a sheet feed error of the latent image forming medium is detected in an early stage of the sheet feeding operation to cease the sheet feeding operation, thereby to prevent the waste of time and labor for restoring the troubled latent image forming medium and resuming the sheet feeding operation.

In order to attain the above objects, according to one aspect of this invention an image forming apparatus having an exchangeable cassette having a sheet feed-out side for accommodating a latent image forming medium therein, exposure means for performing an exposure process of exposing the latent image forming medium to light and pressure-developing means for performing a pressure-developing process of contacting the latent image forming medium having the latent image thereon with a visible image forming medium under pressure, thereby to form a visible image on the visible image forming medium, comprising: sheet feed means for feeding the latent image forming medium to and along a sheet feed path, sheet feeding condition detecting means provided in the vicinity of the feed-out side of the latent image forming medium for detecting the trailing end of the latent image forming medium to judge as to whether or not the latent image forming medium is present in the cassette, memory means for beforehand storing a distance data on the sheet feed path of the latent image forming medium between the sheet feeding condition detecting means and the pressure-developing means, and control means for continuing an exposure process and a pressure-developing process when a detection signal indicating no residue of the latent image forming medium is outputted from the sheet feeding condition detecting means and when it is judged on the distance data and the detection signal that a copied image corresponding to an original image can be obtained.

According to another aspect of this invention, an image forming apparatus having an exchangeable cassette having a sheet feed-out side for accommodating a latent image forming medium therein, exposure means for performing an exposure process of exposing the latent image forming medium to light and pressure-developing means for performing a pressure-developing process of contacting the latent image forming medium having the latent image thereon with a visible image forming medium under pressure, thereby to form a visible image on the visible image forming medium, comprising: sheet feed means for feeding the latent image forming medium to and along a sheet feed path, latent image forming medium detection means provided in the vicinity of the feed-out side of the latent image forming medium for detecting the leading end of the latent image forming medium to detect a sheet feed error of the sheet feeding operation on the basis of the detection result, and control means for ceasing the driving of the sheet feed means when the sheet feeding condition detecting means detects the sheet feed error.

According to another aspect of this invention, an image forming apparatus in which a latent image forming medium is exposed to light to form a latent image on the latent image forming medium and the latent image forming medium having the latent image thereon is contacted with a visible image forming medium under pressure by pressure-developing means to form a visible image on the visible image forming medium, comprising: sheet feed means for feeding the latent image forming medium to and along a sheet feed path, sheet feeding condition detecting means for detecting a feeding condition of the latent image forming medium which is being fed along the sheet feed path by the feeding means, memory means for storing data with respect to the feeding condition of the latent image forming medium according to an output signal from the feeding condition detecting means, and decision means for determining, after the movement of the latent image forming medium by the feeding means has been stopped by a fault and when the fault is eliminated, whether the sheet feeding operation of the latent image forming medium can be resumed or not based on the data stored in the memory means.

The above and other objects, features and advantages of the present invention will become more apparent from the following description when taken in conjunction with the accompanying drawings in which a preferred embodiment of the poresent invention is shown by way of illustrative example.

DETAILED DESCRIPTION OF THE INVENTION

Figure 1:
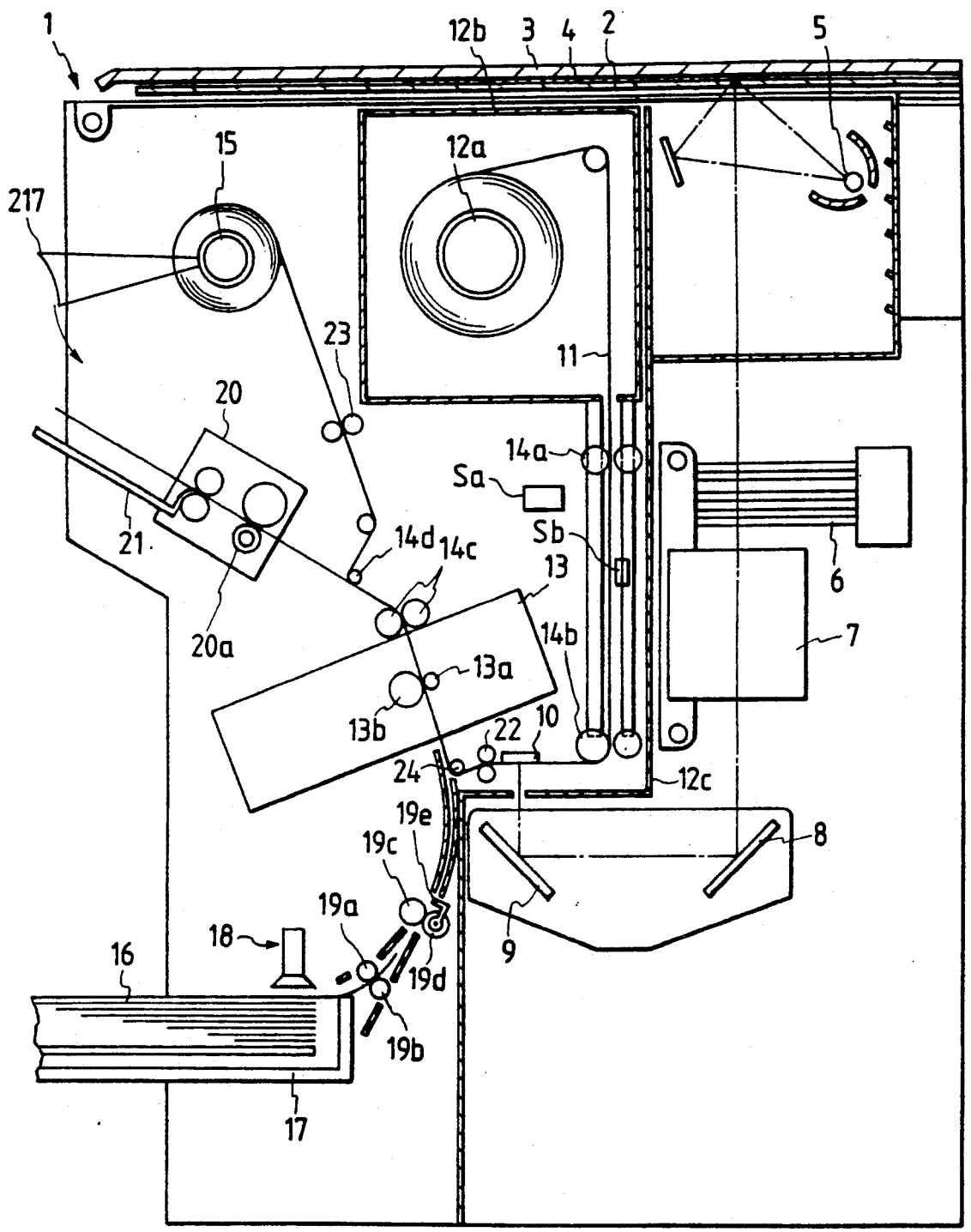
FIG. 1 is a schematic view showing the entire errangment of an image forming apparatus according to this invention.

The preferred embodiments of this invention will be described hereunder with reference to the accompanying drawings.

An image forming apparatus according to the present invention will hereinafter be described with reference to FIG. 1, which schematically shows, as the image forming apparatus, a photosensitive and pressreu-sensitive copying machine capable of copying a full-color image on a visible image forming medium.

The photosensitive and pressure-sensitive copying machine 1 (hereinafter referred to simply as a "copying machine 1") according to this invention employs a photosensitive and pressure-sensitive recording sheet such as a microcapsule sheet serving as a latent image forming medium, and a photosensitive sheet such as a developer sheet serving as a visible image forming medium.

The copying machine 1 includes an upper panel assembly having an original stand glass 2 which is movable back and forth and an original stand cover 3 that can be placed over the original stand cover 2. An original 4 to be copied is placed face down on the original stand glass 2.

The copying machine 1 also has a light source 5 placed in an upper righthand portion thereof, the light source 5 comprising a halogen lamp and a semicylindrical reflecting mirror. The light source 5 emits a linear light through a slit formed in an upper panel of the copying machine 1 toward the original stand glass 2. The light emitted from the light source 5 passes through the transparent original stand glass 2, and is reflected by the original 4 placed on the original stand glass 2. The original 4 on the original stand glass 2 is exposeod to light while moved horizontally, thereby performing a scanning operation of the original 4 with the light.

The light reflected by the original 4 passes through a filter unit 6 comprising plural color filters for adjusting a color tone (balance) of an image to be copied. A lens 7 is provided to project the light whose colors are adjusted by the filter unit 6 onto a pair of reflecting mirrors 8 and 9. The reflecting mirrors 8 and 9 are mounted on a mirror supporting plate which is slightly positionally adjustable to vary the length of the light path and the focusing condition. The light passed through the lens 7 is deflected by two reflecting mirrors 8 and 9, as shown in FIG. 1, and is then irradiated on an elongated microcapsule sheet 11 which is positioned along an exposure stand 10.

The elongated microcapsule sheet 11 is wound around a cartridge shaft 12a which is placed in a cartridge 12b removably installed in the housing of the copying machine 1. The cartridge 12b has a outlet slot for feeding out the microcapsule sheet 11, and near the outlet slot of the cartridge 12b is provided an empty sensor serving as a sheet feeding condition detecting means for detecting at least one of the leading end and trailing end of the microcapsule sheet to determine presence and absence of the microcapsule sheet in the sheet feed path, thereby determining a feeding condition of the microcapsule sheet which is being fed to and along the sheet feed path. As the empty sensor, an optical sensor Sa or a lever sensor Sb, or combination thereof may be used as shown in FIG. 1.

For example, when the empty sensor is used to detect whether the residual quantity of the microcapsule sheet 11 wound on the cartridge shaft 12a becomes zero (that is, the empty sensor is used to detect the trailing end of the microcapsule sheet), the empty sensor produces a detection signal indicative of no residue of the microcapsule sheet wound around of the cartridge shaft 12a. On the other hand, when the empty sensor is used to detect the sheet feed error (that is, the empty sensor is used to detect the leading end of the microcapsule sheet), the empty sensor produces a detection signal indicative of the sheet feed error. In addition to the above empty sensor, there are provided at least one control unit for controlling the sheet feeding operation and performing various processings for preventing the imaging error, for detecting the sheet feed error at an early stage of the sheet feeding operation and so on as described hereinafter.

A leader having a certain length is attached to the leading end of the microcapsule sheet 11 and extends through a sheet feed roller 14a, a guide roller 14b, K-shafts 22 (for example, a driving roller and a nip roller) which are movable toward and away from each other by a K-shaft moving motor 21 (FIG. 2), a dancer roller 24, sheet feed rollers 14c, a pressure-developing unit 13, a separation unit 14d, F-shafts 23 (for example, meander travel control rollers) which are movable toward and away from each other by an F-shaft moving motor 213 (FIG. 2), toward a take-up shaft 15 to which an automatic sheet feed lever 217 is attached. More specifically, the microcapsule sheet 11 drawn out of the lower end portion of the cartridge 12b is fed and guided by the sheet feed rollers 14a and the guide rollers 14b, and extends beneath the exposure stand 10. Then, the microcapsule sheet 11 passes through the K-shafts 22 and the dancer roller 24 into the pressure developing unit 13.

The microcapsule sheet 11 which has passed through the pressure-developing unit 13 is fed by the feed rollers 14c, travels past the separation unit 14d and the F-shafts 23, and is then wound on the take-up shaft 15. The microcapsule sheet 11 discharged from the cartridge 12b remains unexposed by a light-shielding cover 12c. The speed at which the microcapsule sheet 11 is fed is controlled so as to be equal to a certain speed, i.e., the speed at which the original stand glass 2 moves, so that a latent image can be formed successively line by line on the microcapsule sheet 11 when it moves past the exposure stand 10.

A sheet cassette 17 serving as a sheet supply unit is disposed below the pressure-developing unit 13. The sheet cassette 17 is detachably mounted in the housing of the copying machine 1. A sheet supply means 18 in the form of a suction cup for attracting a sheet under vacuum is associated with the sheet cassette 17. The sheet cassette 17 stores a stack of developer sheets as recording sheets. The developer sheets 16 are taken out of the cassette 17 one by one by the sheet supply means 18. The developer sheet 16 which is taken from the cassette 17 is delivered by a sheet feed roller 19a and a pinch roller 19b. After the leading end of the developer sheet 16 is positioned by rollers 19c, 19d and a resist gate 19e, the developer sheet 16 is fed into the pressure-developing unit 13. In place of the suction cup, a sector roller(not shown) may be provided to feed the developer sheets 16 toward the pressure-developing unit 13 one by one. Further, in addition to the suction cup or the sector roller, the developer sheet cassette 17 may be provided with a projection (not shown) for indicating the size of the developer sheets accommodated in the cassette 17. In this case, a size detection unit (not shown) for judging the size of the developer sheet in accordance with the projection is provided to the copying machine.

The microcapsule sheet 11 and the developer sheet 16 are closely contacted with each other under pressure when they are introduced into the pressure-developing unit 13. The microcapsule-coated surface of the microcapsule sheet 11 which carries a latent image and the developer-coated surface of the color developer sheet 16 are held in contact with each other in the pressure developing unit 13. The pressure developing unit 13 includes a smaller-diameter roller 13a and a backup roller 13b, by and between which the microcapsule sheet 11 and the color developer sheet 16 are sandwiched and pressed together. At this time, those microcapsules on the microcapsule-coated surface which are not exposed are ruptured under pressure, thereby forming a developed (visible) image on the developer sheet 16.

The microcapsule sheet 11 and the developer sheet 16 which have left the pressure-developing unit 13 are separated from each other by the separation unit 14d. The developer sheet 16 travels into a heat-fixing unit 20 in which a heater roller 20a promotes color development on the color developer sheet 16 and fixes the color image on the developer sheet 16. Thereafter, the developer sheet 16 is discharged into a discharge tray 21 by discharge rollers. The separated microcapsule sheet 11 travels past the F-shafts 23, and is then wound around the take-up shaft 15.

The following description is made for an embodiment of the image forming apparatus in a case where an empty sensor is used to monitor the sheet feed condition, particularly to detect the trailing end of the latent image forming medium and determine whether the residue of the microcapsule sheet becomes zero, thereby controlling (for example, selectively ceasing) the driving of the pressure-developing unit on the basis of the detection result.

Figure 2:
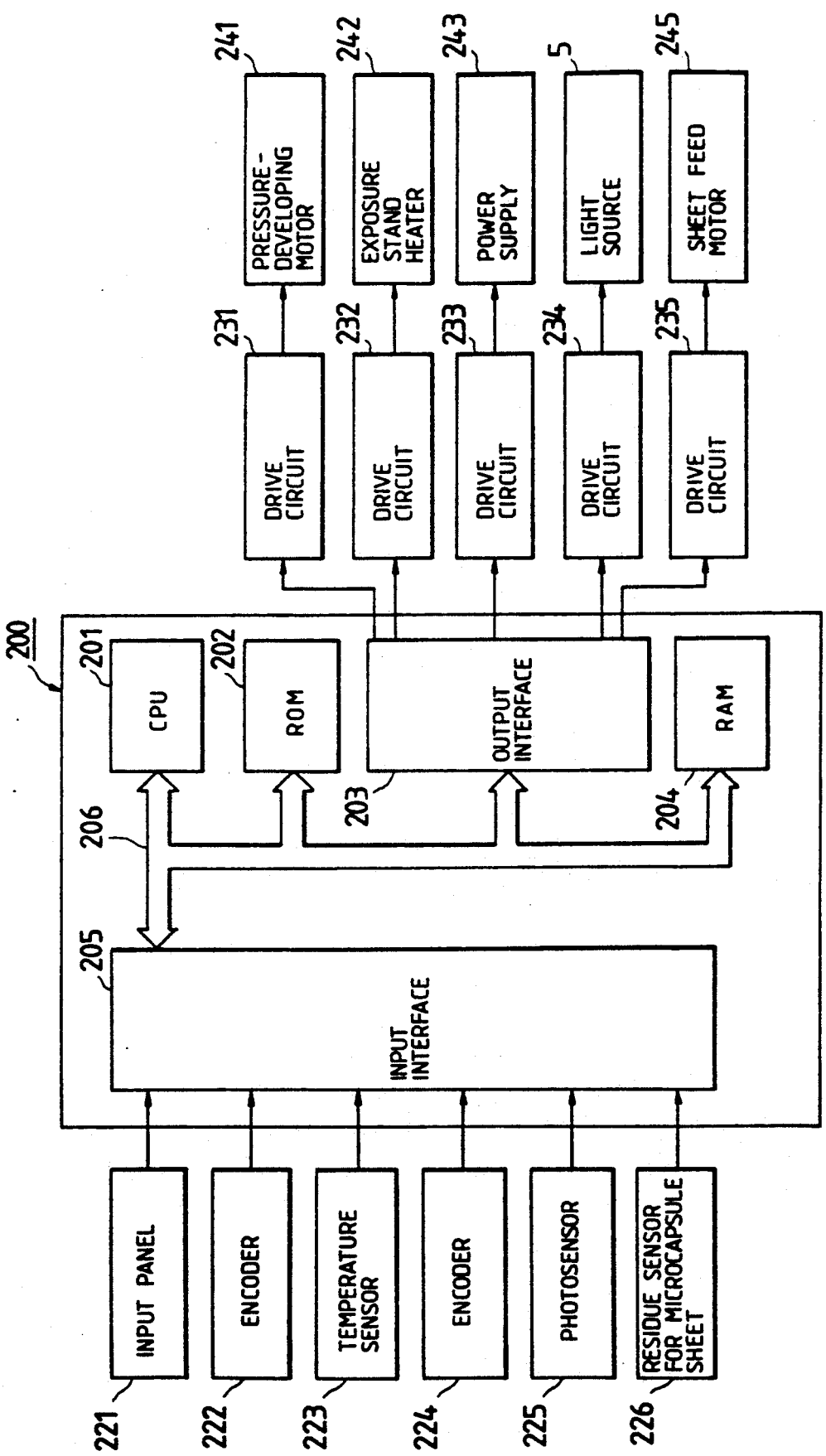
FIG. 2 is a block diagram of a control unit used in the image forming apparatus as shown in FIG. 1.

FIG. 2 is a block diagram for a control unit 200 for controlling a series of operations for a copying process on the basis of a detection signal from the empty sensor for detecting the trailing end of the microcapsule sheet to prevent the imaging error such as soiling of the pressure-developing rollers, formation of an imcomplete (halfway) copied image on the developer sheet and so on.

In this embodiment, an optical sensor Sa as shown in FIG. 1 serving as a residue detection sensor 226 for detecting no residue of the microcapsule sheet wound around the cartridge shaft is used as the empty sensor. As described above, a lever sensor Sb may be used as the empty sensor in place of the optical sensor Sa. In addition to the elements for preforming a series of copying processes as described above, there are provided various elements for performing the above control operation, which comprise an input panel 221 having an information input key and a copy start switch for beforehand setting information on operational conditions of the copying processes, an encoder 222 for detecting a rotation angle of a driving motor 241 for driving the pressure-developing unit, a temperature sensor for detecting the surface temperature of the exposure stand 10, an encoder 224 for detecting a rotation angle of a motor for driving the sheet feed rollers 14a and 14c and so on, a photosensor 225 for detecting an amount of light irradiated from the light source 5, and so on.

In FIG. 2, the control unit 200 for performing the control operation of the driving of the pressure-developing unit and the other elements comprises a microcomputer including a CPU 201 serving as the control means, a ROM 202 serving as the memory means, a RAM 204 for temporarily storing a desired data, an input interface 205, an output interface 203 and a bus 206 for connecting those elements to one another. The input interface 205 of the control unit 200 is supplied with various instruction signals from the input panel, the encoder 222, the temperature sensor 223, the residue detection 226 (Sa in FIG. 1), the encoder 224, the photosensor 225, and so on. On the other hand, various driving signals are supplied from the output interface 203 of the control unit 200 through drive circuits 231, 232, 233, 234 and 235 to the driving motor 241 for the pressure-developing unit, an exposure stand heater 242 for heating the exposure stand, a power source 243 for supplying a power to each element constituting the image forming apparatus, the light source 5, and the sheet feed motor 245 respectively, and a moving unit (not shown) for moving the original stand glass 2 and so on.

The ROM 202 stores a control program therein an non-volatile data. In the ROM 202 is stored data on the operational conditions for performing a series of copying processes of the image forming apparatus as shown in FIG. 1, and distance data on the sheet feed path of the microcapsule sheet which is located between the residue detection sensor Sa for detecting the residual microcapsule sheet and the pressure-developing unit 13, and so on. The RAM 204 stores a desired data for a predetermined period under the control of the CPU 201.

The CPU 201 performs arithmetic and logical operations. When, upon detection of a signal supplied from the input panel 221 through the input interface 205, the CPU 201 recognizes that the copy start switch of the input panel 221 is operated, the CPU 201 suitably outputs a drive instruction signal to each of the drive circuits 231 to 235 to drive each of the elements 241 to 245, thereby performing a series of image forming processes. Further, when a detection signal indicating no residue of the microcapsule sheet, that is, indicating that there is no residual microcapsule sheet wound around the cartridge shaft 12a, is inputted from the residue detection sensor Sa (226) through the input interface 205 to the CPU 201, the CPU 201 continues the exposure and pressure-developing processes by judging from the detection signal and the distance data stored in the ROM regarding the sheet feed path of the microcapsule sheet that a complete copied image corresponding to the original image can be obtained. That is, the CPU 201 outputs the drive instruction signals through the output interface 203 to the drive circuits 231 to 235 to continue the exposure and pressuredeveloping processes.

The operation of the control unit thus constructed will be described with reference to FIGS. 3 and 4.

Figure 3:
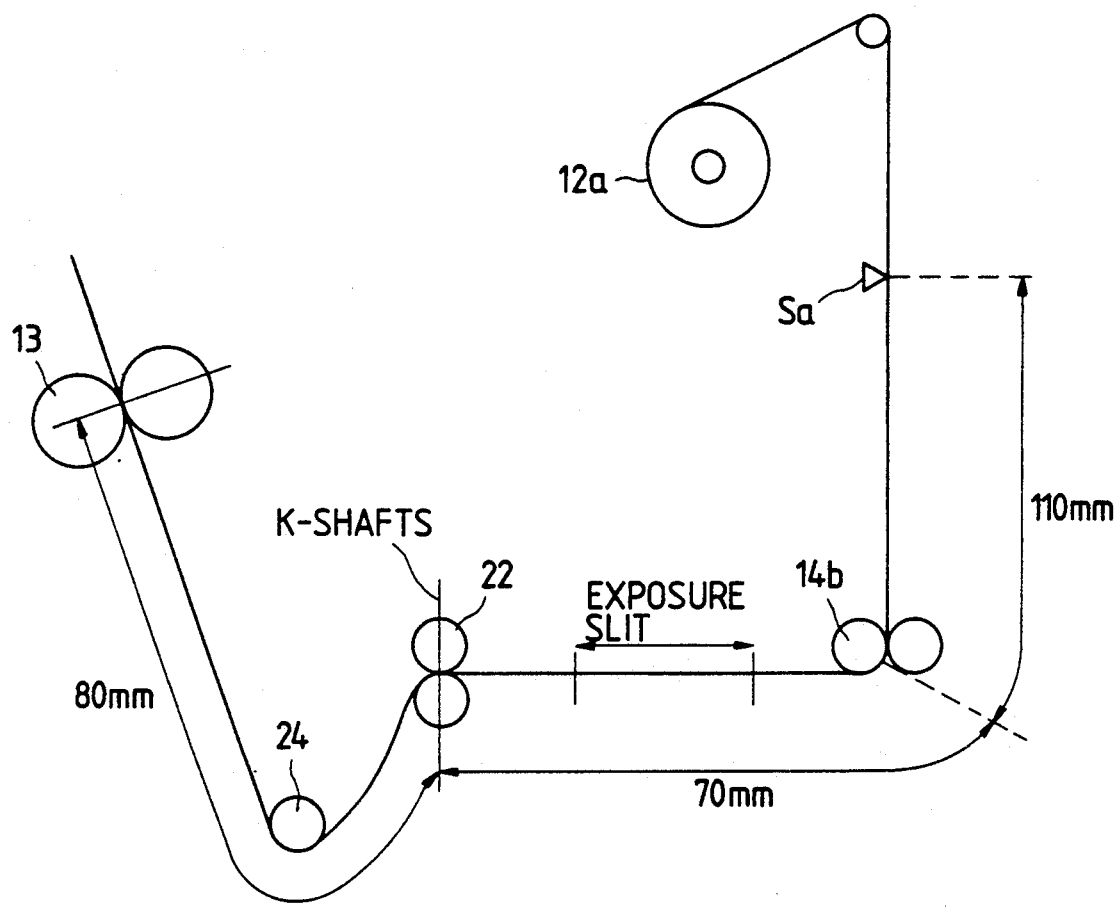
FIGS. 3 and 4 are explanatory diagrams for explaining a control operation of the control unit as shown in FIG. 2.

As is apparent from FIG. 3, in this embodiment the total sheet feeding distance of the microcapsule sheet 11 between the residue detection sensor Sa and the pressuredeveloping unit 13 is approximately 260 mm. In detail, as shown in FIG. 3 the distance between the residue detection sensor Sa and the guide roller 14b is 110 mm, the distance between the guide roller 14b and the K-shaft 42 is 70 mm, and the distance between the K-shaft 42 and the pressure-developing unit 13 is 80 mm.

When the residue detection sensor Sa outputs the detection signal indicating no residue of the microcapsule sheet before commencing a sheet supplying operation of the developer sheet 16 toward the pressure-developing unit 13, the CPU 201 outputs a drive stop instruction signal through the output interface 203 to stop the driving of each element necessary for carrying out the exposure and pressure-developing processes and to stop the sheet supplying operation of the developer sheet 10 toward the pressuredeveloping unit 13. At the same time, the microcapsule sheet 11 remaining at the downstream side of the residue detection sensor Sa is wound up by the take-up shaft 15 by outputting the drive instruction signal through the output interface 203 to the drive circuit 235 to drive the sheet feed motor 245 (a region indicated by (1) of FIG. 4).

Figure 4:
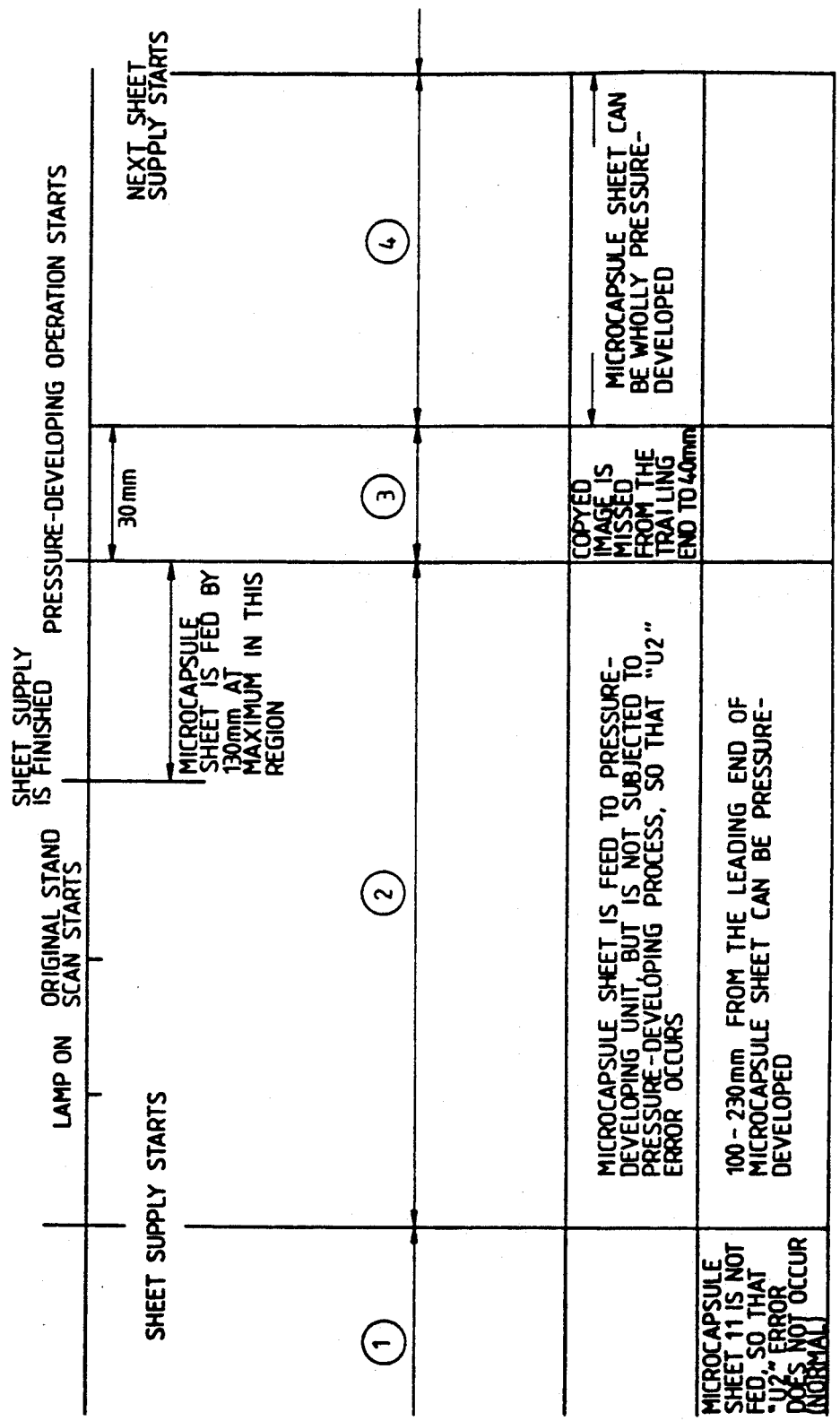

Next, in a region as shown by (2) of FIG. 4, that is, when the detection signal indicating no residue of the microcapsule sheet is outputted from the residue sensor Sa at a time between both of the starting times of the sheet supplying operation of the developer sheet 16 and the pressure-developing operation, the CPU 201 outputs the drive stop instruction signal through the output interface 203 to the drive circuit 231 to cease the driving of the pressure-developing unit 13 because the length of the microcapsule sheet 11 required for the pressure-developing process is limited to 100 to 230 mm as shown in FIG. 3. In this case, when a developer sheet 16 having a copied image formed thereon in the just previous image forming process remains in the apparatus, the CPU 201 outputs the drive instruction signal through the output interface 203 to the drive circuit 235 to drive the sheet feed motor 245 and discharge the developer sheet 16 to the outside of the apparatus.

In a region as shown by (3) of FIG. 4, that is, when the detection signal indicating no residue of the microcapsule sheet wound around the cartridge shaft 12a is outputted from the residue detection sensor Sa after the pressure-developing process is commenced in the pressure-developing unit 13 and before the microcapsule sheet 11 is fed by 30 mm in the pressure-developing unit 13, a part of the copied image which would be originally formed is missed out of a portion of the developer sheet which is located from the trailing end of the developer sheet to a position spaced away at 40 mm from the trailing end. However, since the pressure-developing process has already started, the CPU 201 allows the pressure-developing process to be continued.

In a region as shown by (4) of FIG. 4, that is, when the detection signal indicating no residue of the microcapsule sheet is outputted from the residue detection sensor Sa after the pressure-developing process of the pressure developing unit 13 is commenced and after the microcapsule sheet 11 is fed by 30 mm in the pressure-developing unit 13, the exposure and pressure-developing processes can be completely performed, and therefore the CPU 201 continues to carry out the exposure and pressure-developing processes without interrupting those processes halfway, so that a complete copied image is obtained.

The control manner as described above is one of many control manners to which the embodiment of this invention can be applied, and is performed in accordance with the control manner as shown by (1) to (4) in FIG. 4 (a case 1 as shown in FIG. 4).

In the region (2) of FIG. 4, the developer sheet 16 is not subjected to the pressure developing process. Accordingly, if the operator manually operates each of pertaining elements of the image forming apparatus so that the developer sheet which is not subjected to the pressure-developing process is discharged to the outside of the image forming apparatus, the discharged developer sheet 16 can be reused and therefore the waste of the developer sheet can be reduced. In this case, an U2 error indication, that is, an indication of occurrence of the sheet jam is displayed on a display unit of the image forming apparatus.

However, when the operators wants to save a trouble of the manual operation rather than to save one sheet of the developer sheet 16, another control manner may be used in which the microcapsule sheet 11 and the developer sheet 16 are subjected to the pressure-developing process to form a halfway copied image on a part of the developer sheet which has a length of 100 to 230 mm from the leading end of the developer sheet 16, and thereafter the developer sheet 16 is discharged to the outside of the apparatus without the sheet jam ( a control manner as shown in a case 2 of FIG. 4).

As described above, according to one embodiment of this invention, except for the case ((3) of FIG. 4) where the residue detection sensor Sa outputs the detection signal indicating no residue of the microcapsule sheet after the pressure-developing process starts and before the microcapsule sheet 11 is fed by 30 mm in the pressure-developing unit 13, the complete copied image can be obtained. Accordingly, a possibility that an incomplete (halfway) copied image is formed can be sufficiently reduced.

The following description is made for performing a single copying operation and a successive copying operation using the image forming apparatus of this invention.

(1) Single copying operation (A) When a detection signal indicating no residue of the microcapsule sheet after the image forming operation starts and before the pressure-developing unit is closed, (a) Supply of the developer sheet 16 to the pressure-developing unit 13 is ceased.

(b) For example, the dancer roller 41 (as shown in FIG. 3) is reversely rotated to wind up the microcapsule sheet by 700 mm.

(c) After the microcapsule sheet 11 is wound up, the operator removes the developer sheet from the image forming apparatus in accordance with an error indication on a display unit of the apparatus to thereby enable the apparatus to carry out the automatic sheet feeding operation.

(B) When a detection signal indicating no residue of the microcapsule sheet is outputted after the pressuredeveloping unit 13 is closed and before the microcapsule sheet is fed by 40 mm, (a) The image forming operation is continued, and the pressure-developing unit 13 is opened as soon as possible before the microcapsule sheet 11 is fed by 40 mm.

(b) After the pressure-developing unit 13 is opened, the microcapsule sheet 11 is wound up by 420 mm, and it is judged whether the developer sheet 16 is discharged to the outside of the apparatus.

(C) When a detection signal indicating no residue of the microcapsule sheet 11 is outputted after the pressure-developing unit 13 is closed and the microcapsule sheet 11 is fed by a distance longer that 40 mm to thereby complete the pressure-developing process, (a) The image forming operation is continued.

(b) After the pressure-developing unit 13 is opened, the microcapsule sheet 11 is wound up by a distance corresponding to a sum of 380 mm and a length of the microcapsule sheet which is subjected to the pressure-developing process at the time when the detection signal indicating no residue is outputted, and it is judged whether the developer sheet 16 is discharged to the outside of the apparatus.

(D) When a detection signal indicating no residue of the microcapsule sheet 11 is outputted at the time when the pressure-developing process is completed and the discharge of the developer sheet 16 to the outside of the apparatus is finished, (a) A routine for performing the image forming process is finished.

(b) The microcapsule sheet 11 is wound up by 700 mm, and it is judged whether the developer sheet is discharged to the outside of the apparatus.

(2) A successive copying operation (A) When a detection signal indicating no residue of the microcapsule sheet 11 at a time between the completion of the exposure process (for a (n−1)th sheet) and the closing of the pressure-developing unit 13 (for an n-th sheet), (a) Supply of the developer sheet 16 to the pressure-developing unit 13 is ceased.

(b) The image forming process for the (n−1)th sheet is continued until the pressure-developing process for the (n−1)th sheet is finished.

(c) The microcapsule sheet 11 is wound up by 700 mm, and it is judged whether the developer sheet 16 is discharged to the outside of the apparatus.

(d) After the microcapsule sheet 11 is wound up, the operator removes the developer sheet 16 from the apparatus in accordance with an error indication on a display unit of the apparatus to thereby enable the apparatus to carry out the automatic sheet feeding operation.

(B) When a detection signal indicating no residue of the microcapsule sheet 11 is outputted after the pressure developing unit 13 is closed and before the microcapsule sheet 11 is fed by 40 mm, (a) The image forming operation is continued, and the pressure-developing unit 13 is opened as soon as possible before the microcapsule sheet 11 is fed by 40 mm.

(b) After the pressure-developing unit 13 is opened, the microcapsule sheet is wound up by 420 mm, and it is judged whether the developer sheet 16 is discharged to the outside of the apparatus.

(C) when a detection signal indicating no residue of the microcapsule sheet 11 is outputted after the pressure-developing unit 13 is closed, and the microcapsule sheet 11 is fed by a distance longer than 40 mm, so that the exposure process is finished, (a) The image forming process is continued, (b) After the pressure-developing unit 13 is opened, the microcapsule sheet 11 is wound up by a distance corresponding to a sum of 380 mm and a length of the microcapsule sheet which is subjected to the pressure-developing process at the time when the detection signal indicating no residue is outputted, and it is judged whether the developer sheet 16 is discharged to the outside of the apparatus.

(D) When a detection signal indicating no residue of the microcapsule sheet 11 is output at the time when the pressure-developing process is completed and the discharge of the developer sheet 16 to the outside of the apparatus is finished, (a) A routine for performing the image forming process is finished.

(b) The microcapsule sheet 11 is wound up by 700 mm, and it is judged whether the developer sheet is discharged to the outside of the apparatus.

As described above, according to this embodiment, when a detection signal indicating no residue of the latent image forming medium such as a microcapsule sheet is outputs the exposure process and the pressure-contacting process are continued if it is judged on the basis of detection signal and the distance data that a complete copied image corresponding to the original image can be obtained. Therefore, even though the latent image forming medium becomes zero, the pressure-developing unit can be prevented from being soiled and the sheet jam of the visual image forming medium such as a developer sheet can be prevented. Further, formation of a halfway copied image on the visual image forming medium can be also prevented. As a result, it is possible to provide an image forming apparatus in which the waste of the visible image forming medium can be prevented.

The following description is made for another embodiment of the image forming apparatus of this invention in a case where an empty sensor is used to detect the sheet feeding condition, particularly to detect the leading end of the latent image forming medium and determine whether a sheet feed error occurs, thereby detecting the sheet feed error at an early stage of the sheet feeding operation which is carried out after an used cassette is exchanged for a new one by the operator.

In this embodiment, a lever sensor Sb as shown in FIG. 1 serving as the empty sensor is used to detect the leading end of the unused microcapsule sheet, thereby judging as to whether the microcapsule sheet 11 is present or not in the sheet feed path, and output a detection signal indicative of the detection result. As described above, the optical sensor Sa may be used to detect the leading end of the microcapsule sheet in place of the lever sensor Sb. Further, a control unit for detecting the sheet feed error at an early stage of the sheet feeding operation is provided to the image forming apparatus. The control unit 200 as shown in FIG. 2 may be used in this embodiment. In this case, the control unit 200 has both functions of preventing the imaging error as described above, and preventing the sheet feed error as described below. However, another control unit having the substantially same construction as that of FIG. 2, that is, a control unit having a CPU, a ROM, a NVRAM (nonvolatile RAM), an input interface and an output interface may be provided independently of the control unit 200 as shown in FIG. 2.

Figure 5:
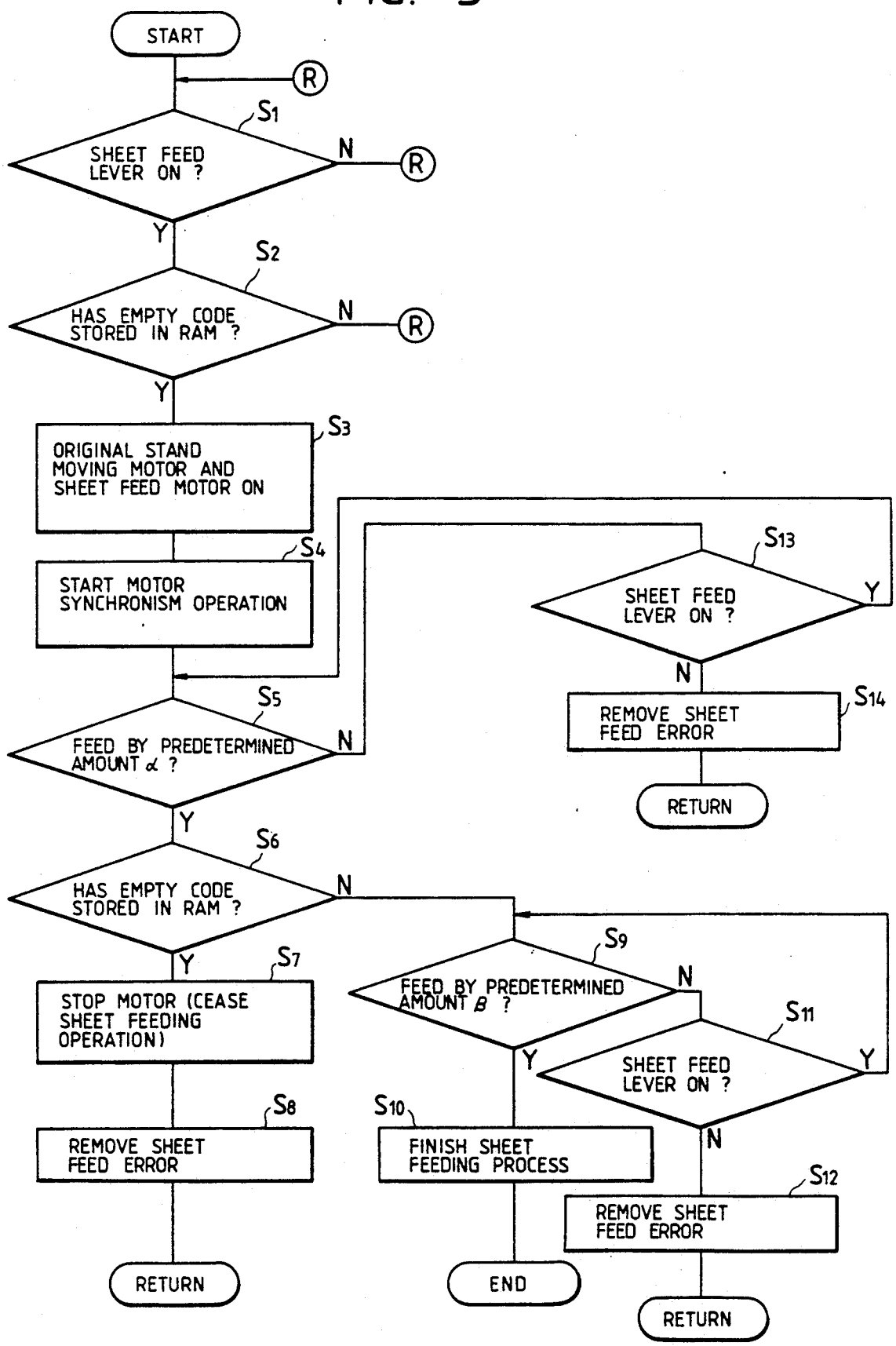
FIG. 5 is a flowchart for detecting a sheet feed error of the image forming apparatus as shown in FIG. 1.

FIG. 5 is a flowchart for detecting the sheet feed error at an early stage of the sheet feeding operation on the basis of the detection signal from the lever sensor Sb.

In a case where the operator exchanges the used cassette for a new one in accordance with an empty indication which is made on an LED display unit (not shown) in a state where the microcapsule sheet has been wholly wound up by the take-up shaft 15, the operator switches a sheet feed lever (not shown) to an ON-state (in a step S1). After it is confirmed by a control unit (not shown) that an empty code representing that the microcapsule sheet is not present has been already stored in the RAM (in a step S2)), an original stand moving motor, a sheet feeding motor 245 for driving the sheet feed rollers, and a pressure-developing motor 241, both of which are used as the sheet feeding means for performing the sheet operation, are driven (in a step S3) to draw the leading end of the microcapsule sheet 11 out of the cassette 12b and fed it through the predetermined sheet feed path of the image forming apparatus by a predetermined amount (distance) $\alpha$ while the rotation of each sheet feed roller is synchronized with that of another sheet feed roller with a pulse number of the above motors to allow the sheet feed speeds of the sheet feed rollers to coincide with one another (in a step S4). In this case, the predetermined amount $\alpha$ is beforehand set to the amount (distance) at which the leading end of the microcapsule sheet 11 is sufficiently passed over the lever sensor Sb.

Further, it is judged whether or not the microcapsule sheet 11 is fed by the predetermined amount $\alpha$ by the above motors (in a step S5). The predetermined amount $\alpha$ is judged on the basis of the count number of an encoder secured to a shaft of at least one of the above motors, such as the encoders 222 and 224 as shown in FIG. 2, and the count is started from a time when the sheet feeding operation is started. If the microcapsule sheet 11 has been fed by the predetermined amount $\alpha$, it is judged whether the empty code has been stored in the RAM (in a step S6). This judgment is adopted to confirm whether the empty code stored in the RAM is clearly reset when the microcapsule sheet 11 is fed by the predetermined amount $\alpha$, that is, the leading end of the microcapsule sheet 11 is passed over the lever sensor Sb, so that no empty detection signal is outputted (that is, when the empty state is released). At this time, the lever sensor Sb effectively operates to detect the occurence of the sheet feeding error at an early stage of the sheet feeding operation.

If the empty code is judged to be stored in the RAM, the leading end of the microcapsule sheet 11 has not yet passed over the lever sensor Sb and therefore the sheet feed error occurs. Accordingly, the control unit stops the above motors to cease the sheet feeding operation (in a step S7) and performs a processing for correcting the sheet feeding error resuming the sheet feeding operation (in a step S8). Since the sheet feed error can be detected at an early stage and thus the sheet feeding operation of the sheet feeding means is at an early stage after the sheet feeding operation starts, it can be beforehand prevented for the microcapsule sheet to be erroneously wound around another sheet feed roller due to the sheet feed error and thus the time and labor required for restoring the troubled microcapsule sheet can be reduced.

On the other hand, if the empty code is judged not to be stored in RAM (in a step S6), the motors are driven to feed the microcapsule sheet 11 along the sheet feed path by a predetermined amount $\beta$ which is required for winding the leading end around the take-up roller 15, and it is judged whether the microcapsule sheet 11 is fed by the predetermined amount $\beta$ (in a step S9). Like the predetermined amount $\alpha$, the predetermined amount $\beta$ is judged on the basis of the count number of the encoder. If it is judged that the microcapsule sheet is fed by the predetermined amount $\beta$, that is, the whole sheet feeding operation is carried out, a processing for finishing the sheet feeding operation is carried out (in a step S10). On the other hand, if it is judged that the microcapsule sheet is not fed by the predetermined amount $\beta$, it is judged whether the sheet feed lever is switched to the ON-state. The judgment as to whether the sheet feed lever is switched to the ON-state is adopted to judge as to whether the operator switches the sheet feed lever to an OFF-state during the sheet feeding operation. If the sheet feed lever is judged to be in the ON-state, the feeding operation of the microcapsule sheet is continued until the microcapsule sheet is fed by the predetermined amount $\beta$ (in a step S9). If the sheet feed lever is judged to be in the OFF-state, the processing for correcting the sheet feed error is carried out (in a step S12).

Further, as a result of judging as to whether the microcapsule sheet is fed by the predetermined amount $\alpha$ by the motors as described above (in a step S5), if it is judged that the microcapsule sheet is not fed by the predetermined amount $\alpha$, it is judged whether the sheet feed lever is in the ON-state (in a step S13). If it is judged that the sheet feed lever is in the ON-state, the sheet feeding operation is continued until the microcapsule sheet is fed by the predetermined amount $\alpha$ (in a step S5). If it is judged that the sheet feed lever is in the OFF-state, the processing for correcting the sheet feed error is carried out (in a step S14).

Figure 6:
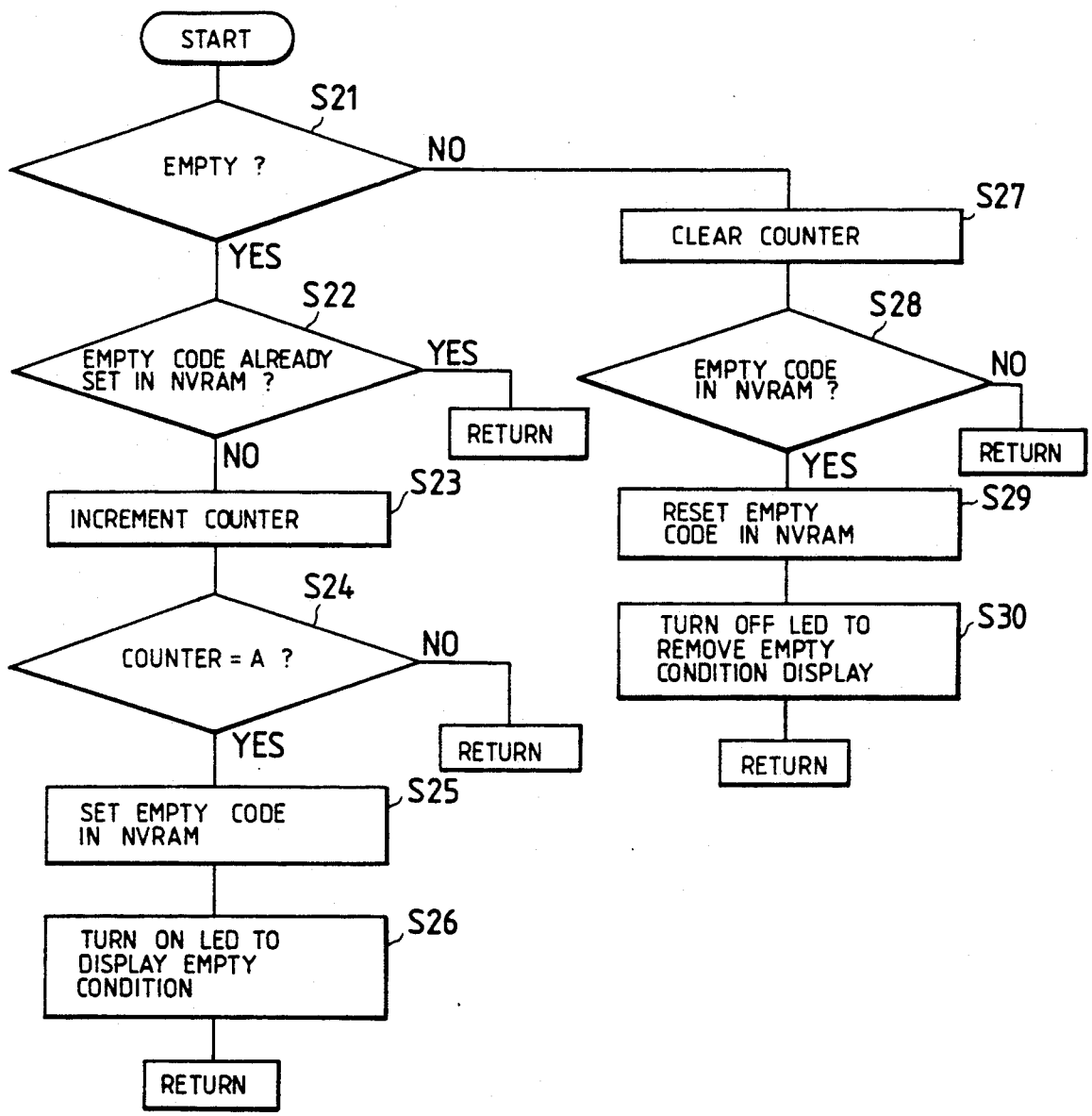
FIG. 6 is a flowchart for preventing a chattering of the sensor as shown in FIG. 1 and for detecting whether the microcapsule sheet is present or not in the sheet feed path.

In order to prevent the lever sensor Sb serving as the empty sensor from chattering in the above operation sequence and detect whether the microcapsule sheet is present or not in the sheet feed path, a routine as shown in FIG. 6 is carried out as an interrupt routine during the period of several hundred msec. (for example, 200 msec.). More specifically, as shown in FIG. 6, if the detection signal indicating a no-sheet condition, that is, indicating that the leading end of the microcapsule sheet is not present in the sheet feed path, is produced by the empty sensor in a step S21, it is determined in a step S22 whether the empty code has already been set in the NVRAM. If the empty code is not set in the NVRAM, then a counting operation whose number is incremented each time an interrupt routine is carried out (in 5 msec. for example) is carried out by a counter in a step S23. If the count number of the counter has reached A (A=40, for example) in a step S24, the empty code is set in the NVRAM in a step S25, and an LED indicator in the input panel is turned on to indicate an empty condition in a step S26.

If a signal indicating no-sheet condition is not produced in the step S21, then the counter is cleared in a step S27. If it is thereafter found in a step S28 that the empty code is set in the NVRAM, then it is reset in a step S29, and the LED indicator is turned off so as not to indicate an empty condition in a step S30.

As described above, according to the above embodiment, the empty sensor serving as the sheet feeding condition detecting means detects at an early stage of the sheet feeding operation whether or not the latent image forming medium such as a microcapsule sheet is present in the sheet feed path to thereby determine at an early stage of the sheet feeding operation whether or not the sheet feed error of the sheet feeding means occurs. Accordingly, after the sheet feeding operation starts, the sheet feed error is detected to cease the sheet feeding operation of the sheet feeding means if the empty state of the latent image forming medium is not released after the feeding operation of the latent image forming medium by the predetermined amount, so that the sheet feed error is detected at an early stage of the sheet feeding operation. As a result, a trouble that it requires more time and labor to restore a troubled latent image forming medium which is erroneously wound around another sheet feed roller due to the sheet feed error can be prevented beforehand, and a failure of drawing the leading end of the latent image forming medium from the cassette is detected at an early stage before the elapse of a time required for winding the latent image forming medium around the take-up shaft, and therefore a waste of time is prevented.

According to the above automatic sheet feeding control process, however, even if the above automatic sheet feeding operation is interrupted by some errors such as a power supply cutoff in the image forming apparatus, no provision is made for storing the condition of the sheet feeding operation. Therefore, when the automatic sheet feeding operation is to be resumed, the operator has to remove the microcapsule sheet from the image forming apparatus and then start the automatic sheet feeding operation all over again. Consequently, the efficiency of automatic sheet feeding process is low.

The following description is made for another embodiment of the image forming apparatus capable of overcoming the above disadvantage.

Figure 7:
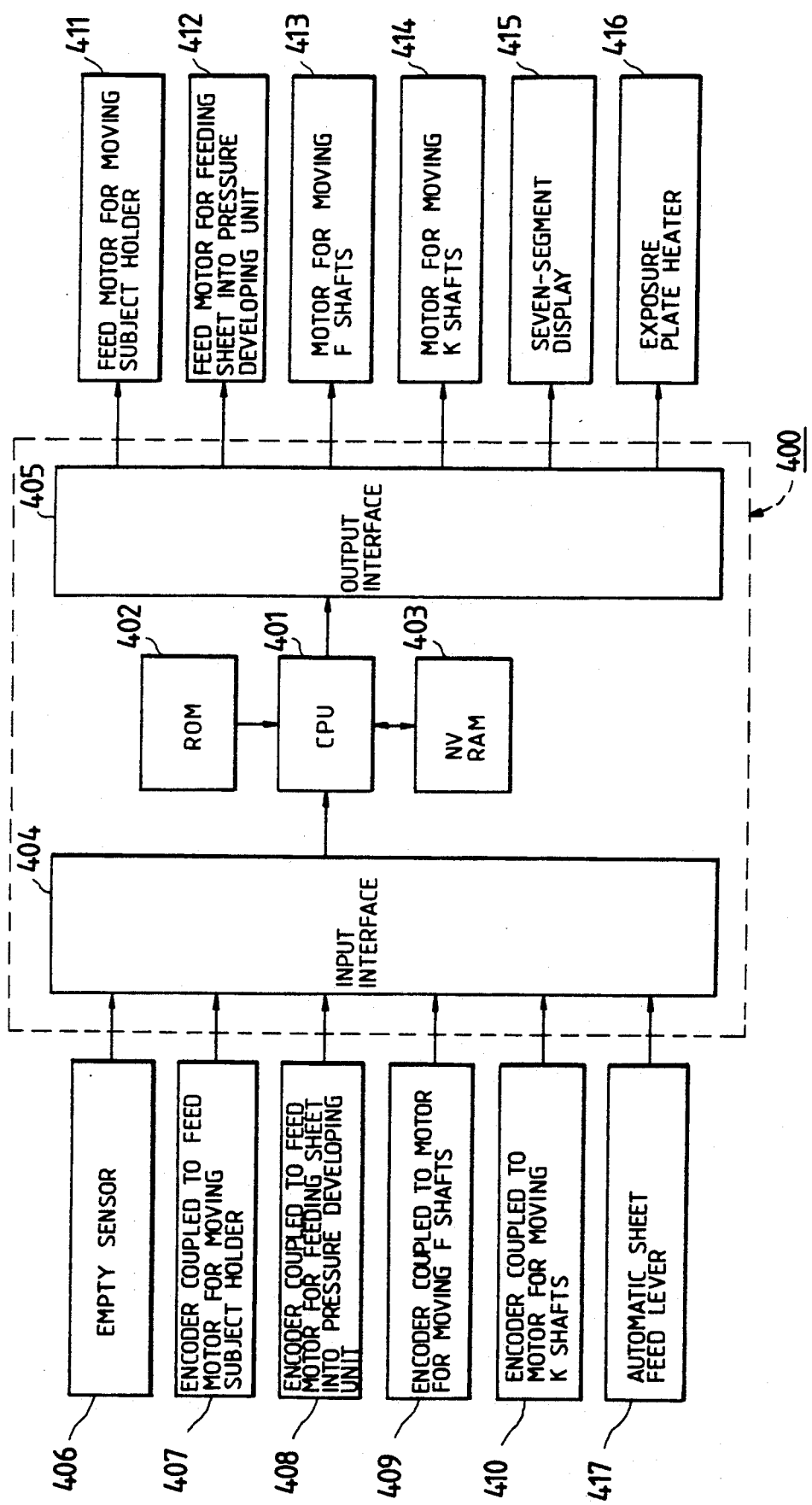
FIG. 7 is a block diagram of another embodiment for detecting a sheet feeding condition and controlling the elements for performing a sheet feeding operation.

FIG. 7 is a block diagram showing another control unit 400 used in the image forming apparatus to overcome the above disadvantage.

As shown in FIG. 7, the control unit 400 comprises a microcomputer including a CPU 401 serving as a decision means for effecting arithmetic and logic operations, a ROM 402 for storing a control program, a NVRAM (nonvolatile RAM) 403 serving as a memory means, an input interface 404 which is supplied with various detection signals from various elements for detecting the present sheet feeding condition, such as an empty sensor 406 comprising an optical sensor or a lever sensor as described above, an encoder 407 associated with a moving motor for moving the original stand glass, an encoder 407 associated with a sheet feed motor for feeding the microcapsule sheet into the pressure-developing unit, an encoder 409 associated with a motor for moving the F-shafts, an encoder 410 associated with a motor for moving the K-shafts and the sheet feed lever 417. The encoders 407 through 410 produce output signals which represent angular displacements of the associated motors. On the other hand, the output interface 405 outputs various instruction signals to a moving motor 411, serving as a moving means, for moving the original stand glass, a sheet feed motor 245, serving as a sheet feeding means, for feeding the microcapsule sheet 11 into the pressure-developing unit, a motor 413 for moving the F-shafts, a motor 414 for moving the K-shafts, a seven-segment display 415, and an exposure stand heater 242.

Figure 8A:
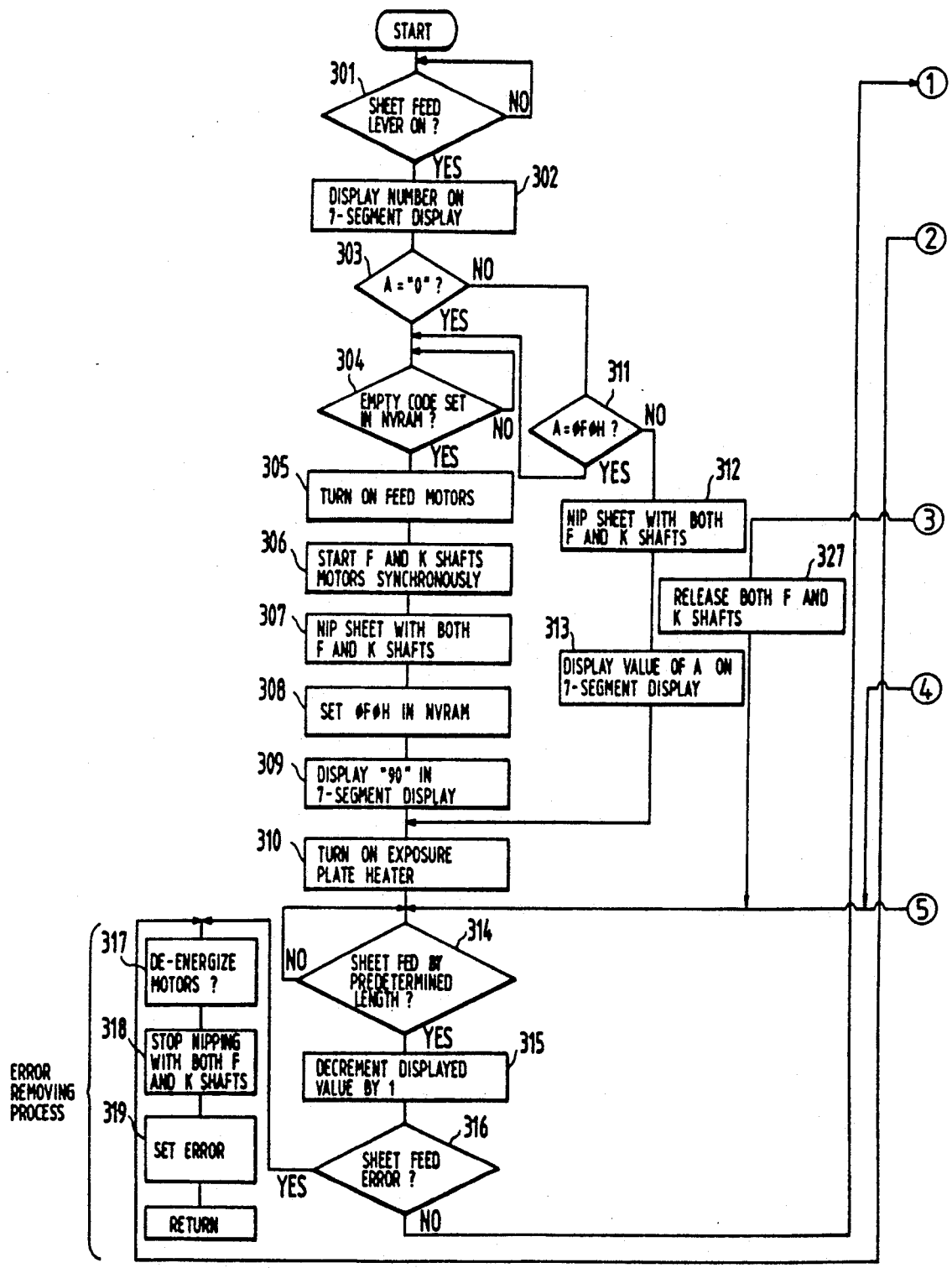
FIGS. 8(A) and 8(B) are a flowchart for explaining a control operation of the control unit as shown in FIG. 7.
Figure 8B:
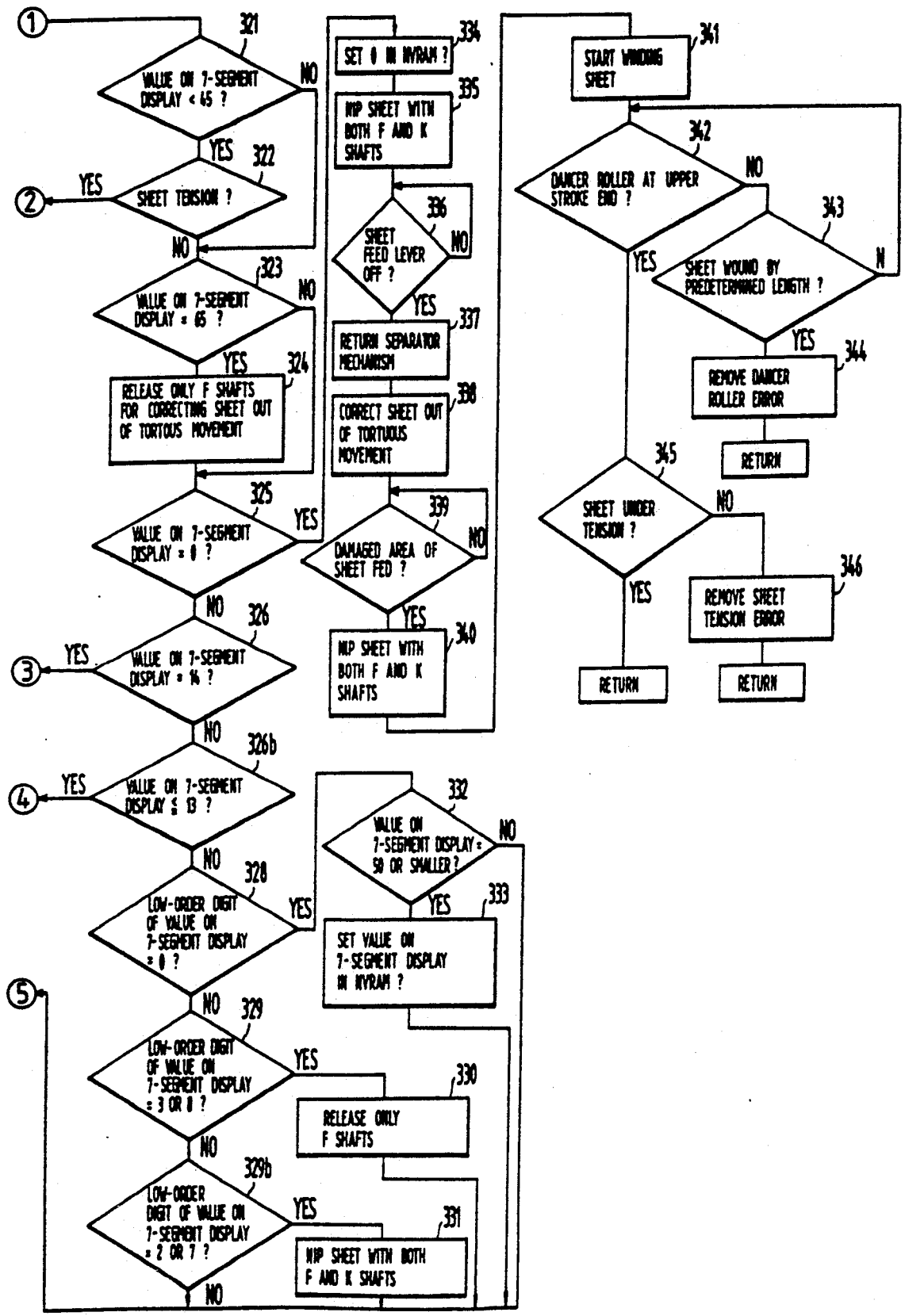

A control operation of the control unit thus constructed will be described below primarily with reference to the flowchart of FIGS. 8(A) and 8(B).

An automatic sheet feeding process is started when the sheet feed lever 217 is turned on. If the sheet feed lever 217 is depressed and hence turned on while the microcapsule sheet 11 is empty (in a step 301), the CPU 200 displays a two-digit decimal number, which indicates data as shown in the Table and stored in the NVRAM 203 for the automatic sheet feeding process, on the seven-segment display 415 in a step 302. Numbers which are selectively displayed on the seven-segment display 415 in the step 302 are defined in the Table.

The maximum number displayed on the seven-segment display is "90". Each time the microcapsule sheet 11 is fed by a distance of 20 and several mm, the displayed number is decremented by 1, letting the operator know how the automatic sheet feeding process is progressing. Therefore, when the number "90" is displayed on the seven-segment display 415, the microcapsule sheet 11 will be fed approximately 1800 mm until "0" is displayed. After the step 302, a step 303 determines whether the automatic sheet feeding process has been successful or not (i.e., whether A=0 or not) in the previous copying cycle. If A=0, i.e., the automatic sheet feeding process has been successful in the previous copying cycle, then a step 304 determines whether the microcapsule sheet 11 is empty in the previous copying cycle, i.e., whether an empty code is set in the NVRAM 203. The checking step 304 is carried out to determine the need of effecting a new sheet feeding process by checking if the microcapsule sheet 11 has all been consumed in the previous copying cycle. If the empty code is found set in the NVRAM 403 in the step 304, then a new automatic sheet feeding process is started in steps 305, 306, 307 (where the F-shafts 23 and the K-shafts 22 are driven to nip the sheet). Then, the CPU 400 sets φFφH at a prescribed address in the NVRAM 403 in a step 308, and displays "90" on the seven-segment display 415 through the output interface 405 in a step 309.

If A is not zero in the step 303, a step 311 determines whether the value of A is one of "51"–"90" in the Table. If the value of A is one of "51"–"90", then control goes to the step 304. If the value of A is not one of "51"–"90", then since it is one of "50"–"1", it is possible to resume the automatic sheet feeding process. Therefore, the automatic sheet feeding process is continued in a step 312 (which is the same as the step 307). Then, the value of A is displayed on the seven-segment display 415 in a step 313. After the step 313 has been carried out, control proceeds to a step 310 in which the CPU 400 turns on the exposure stand heater 216 through the output interface 405. Thereater, control goes to a step 314 which determines whether the microcapsule sheet 11 has been fed by a certain interval (e.g., 20 and several mm). If the microcapsule sheet 11 has been fed by the interval, then the value displayed on the seven-segment display 415 is decremented by 1 in a step 315 which is followed by a step 316. If the step 316 detects a sheet feed error such as a motor error, returning of the sheet feed lever (by which the path of movement of the microcapsule sheet 11 is varied), or detection of dancer roller at the lower stroke end, then an error removing process is carried out in steps 317 through 319. The error removing process is effected for the following reasons: Since the microcapsule sheet 11 is generally not rigid enough, the relatively rigid leader of certain length is attached to the leading end of the microcapsule sheet 11. After elapse of a predetermined period of time from the start of the automatic sheet feeding process, if the microcapsule sheet 11 is not fed by a prescribed distance, then the leader may not be pulled out, or the microcapsule sheet 11 is not well nipped by the F-shafts 23 and the K-shafts 22. Such an error is removed by the error removing process. If the above sheet feed error is not detected in the step 316, then a step 321 determines whether the value displayed on the seven-segment display 415 is smaller than "45" or not. If the value displayed on the seven-segment display 415 is smaller than "45", then it means that when the tension of the microcapsule sheet 11 is detected by a film tension sensor (not shown), the microcapsule sheet 11 has passed through a different path from the desired path in the automatic sheet feeding process. Therefore, it is necessary to effect the error removing process in the steps 317 through 319 (the nipping of the sheet by the F-shafts 23 and the K-shafts 22 is stopped in the step 318). If the microcapsule sheet 11 is found not tensioned in a step 322, then a step 323 determines whether the value displayed on the seven-segment display 415 is "65" or not. If the value displayed on the seven-segment display 415 is "65" (65–64), then inasmuch as the meandering movement of the microcapsule sheet 11 needs to be corrected, the motor 213 is energized to move the F-shafts 23 away from each other in a step 324. Therefore, when one of the numbers between "90" and "65" is displayed, the F-shafts 23 and the K-shafts 22 are caused to nip the microcapsule sheet 11. When "65" or "64" is displayed, only the F-shafts 23 are moved away from each other. When "63" or a smaller number is displayed, the microcapsule sheet 11 is nipped again by both the F-shafts 23 and the K-shafts 22. After the step 324 has been effected, a step 325 checks if the value displayed on the seven-segment display 215 is "0" or not. If the value displayed on the seven-segment display 215 is not "0", then a step 326 determines whether the value displayed on the seven-segment display 215 is "14" or not. If the displayed value is "14", then the motors 413 and 414 are energized to move the F-shafts 23 and the K-shafts 22 away from each other to correct the meandering movement of the microcapsule sheet 11 in a step 327, after which control goes to the step 314. If the value displayed on the seven-segment display 215 is not "14" in the step 326, then the CPU 400 determines whether the value displayed on the seven-segment 415 is smaller than or equal to "13" or not in a step 326b. If the displayed value is smaller than or equal to "13", then the F-shafts 23 and the K-shafts 22 are moved away from each other, after which control goes back to the step 314. If the lower-order digit of the value displayed on the seven-segment display 415 is "0", i.e., if the displayed value is one of "50", "40", "30", and "20" in a step 328, and if the displayed value is "50" in a step 332, control returns to the step 314. If the value displayed on the seven-segment display 415 is smaller than "50" in the step 332, the displayed value is set in the NVRAM 203 in a step 333, and therafter control returns to the step 314. If the lower-order digit of the value displayed on the seven-segment display 415 is not "0" in the step 328 and also if the lower-order digit of the displayed value is "3" or "8" in a step 329, then the motor 213 is energized to move the F-shafts 23 away from each other to correct the meandering movement of the microcapsule sheet 11 in a step 330, from which control goes back to the step 314. If the lower-order digit of the value displayed on the seven-segment display 415 is not "3" or "8" in the step 329 and also not "2" or "7" in a step 329b, then control immediately returns to the step 314. If the lower-order digit of the value displayed on the seven-segment display 415 is "2" or "7" in the step 329b, then the motors 413 and 414 are energized to correct the meandering movement of the microcapsule sheet 11 in a step 331, and thereafter control returns to the step 314. The routine from the step 321 through the step 331 to the step 314 is therefore a process of correcting the meandering movement of the microcapsule sheet 11.

If the value displayed on the seven-segment display 415 is found to be "0" in the step 325, then "0" is set in the NVRAM 403 in a step 334, and the microcapsule sheet 11 is nipped by the F-shafts 23 and the K-shafts 22 in a step 335. If it is detected in a step 336 that the automatic sheet feed lever is turned off, and a lever return error "U4" (prompting the operator to close the upper panel of the copying machine and return the automatic sheet feed lever 417 to the original position) is displayed on the seven-segment display 415, since the automatic sheet feeding process is finished, the microcapsule sheet 11 is set into a path in a copying cycle, which is different from the path in the automatic sheet feeding process, and the separation unit is returned (i.e., the motor 412 is deenergized and only the motor 411 is energized) in a step 337. Then, the meandering movement of the microcapsule sheet 11 is corrected in a step 338. If a step 339 confirms that an area of the microcapsule sheet 11 which has been damaged by the nipping by the F-shafts 23 and the K-shafts 22 in the step 335 has been fed (e.g., over a distance of about 200 mm), then the microcapsule sheet 11 is nipped again by the F-shafts 23 and the K-shafts 22 in a step 340, and the take-up shaft 15 starts winding up the microcapsule sheet 11 in a step 341. A step 342 checks whether the dancer roller 24 which is free is set at the upper stroke end. If the dancer roller 24 is not set at the upper stroke end, and if the microcapsule sheet 11 is wound by a certain length in a step 343, then a prescribed processing for removing such a dancer error is carried out in a step 344.

If the dancer roller 24 is set at the upper stroke end in the step 342, control goes to a step 345. Since the microcapsule sheet 11 has already returned from the path in the automatic sheet feeding process to the path in the copying cycle, the microcapsule sheet 11 must be subjected to a predetermined tension at this time. Therefore, when a signal indicating the tension is produced from the film tension sensor (not shown) in the step 345, the copying cycle is readied. If the tension of the microcapsule sheet 11 is detected in the step 345, such a sheet tension error is removed in a step 346.

In the embodiment of the present invention, an interrupt routine, as shown in FIG. 6, for preventing the empty sensor 406 from chattering can be also executed at intervals of about 5 msec. during the period of about 200 msec. in the step 303.

According to the embodiment of the present invention, as described above, after an automatic sheet feeding process is interrupted by a certain fault (such as a power supply cutoff or an error) and when such a fault is eliminated, the automatic sheet feeding process is resumed if such resumption of the automatic sheet feeding process is possible. Therefore, the efficiency of automatic sheet feeding operation is greatly increased. That is, according to the above embodiment, after the movement of the latent image forming medium by the feeding means has been stopped by a fault and when the fault is eliminated, it is determined whether the movement of the latent image forming medium can be resumed or not based on the data stored in the memory means. If it is found that the movement of the latent image forming medium can be resumed, the process of automatically feeding the latent image forming medium is resumed. Therefore, after an automatic sheet feeding operation is interrupted by some error such as a power supply cutoff in the image forming apparatus, and when the power supply is recovered and the error is eliminated, the interrupted automatic sheet feeding operation can be resumed if such resumption of the interrupted automatic sheet feeding operation is possible, so that the efficiency of automatic sheet feeding process is greatly increased.

TABLE

| Seven-segment display | | Addresses of NVRAM | |
| --- | --- | --- | --- |
| 51-90 | ("90" indicates that the empty sensor is turned-on by the sheet being fed. The number is decremented by 1 each time the sheet is fed 20 and several mm. "50" indicates 1 or 2 turns of the sheet wound on the takeup shaft. No copying operation is possible when an error is caused or the power supply is turned off.) | φFφH | (The left value is displayed as it is on the seven-segment display. While it is stored as a hexadecimal number, it is displayed as a decimal number (such as 51-90, 41-50). The data in the memory are not updated.) |
| 41-50 | (When "50"–"41" is displayed, since the microcapsule-coated sheet is wound by 1 or 2 turns on the takeup shaft, the sheet can continuously be fed. However, no pressure image development is possible since the leader of the microcapsule-coated sheet is present in the pressure developing unit.) | 50H | (The same as above.) |
| 31-40 | (The same as above. However, as the | 40H | (The same as above.) |

TABLE-continued

| Seven-segment display | | Addresses of NVRAM | |
|---|---|---|---|
| | leader of the sheet remains in the pressure developing unit, there is a sheet area where no image is developed even by pressure development.) | | |
| 21–30 | (The same as above.) | 30H | (The same as above.) |
| 1–20 | (The same as above.) | 20H | (The same as above.) |
| 00 | (The automatic sheet feeding process is fully completed, and images can be developed in the entire available sheet area. Copying operation is possible.) | 0H | (The same as above.) |

What is claimed is:

1. An image forming apparatus having an exchangeable cassette having a sheet feed-out side for accommodating a latent image forming medium therein, exposure means for performing an exposure process of exposing the latent image forming medium to light and pressure-developing means for performing a pressure-developing process of contacting the latent image forming medium having the latent image thereon with a visible image forming medium under pressure, thereby to form a visible image on the visible image forming medium, comprising:

sheet feeding means for feeding the latent image forming medium from the sheet feed-out side of the cassette to and along a sheet feed path and winding up the latent image forming medium to thereby perform a sheet feeding operation;

sheet feeding condition detecting means provided in the vicinity of the sheet feed-out side of the latent image forming medium for detecting the latent image forming medium in the sheet feeding operation to determine whether or not residual quantity of the latent image forming medium becomes zero and outputting a detection signal indicative of a detection result;

memory means for beforehand storing distance data on the sheet feed path of the latent image forming medium between said sheet feeding condition detecting means and said pressure-developing means; and control means for continuing the exposure process and the pressure-developing process when a detection signal indicating no residue of the latent image forming medium is outputted from said sheet feeding condition detecting means and when it is judged based on the distance data and the detection signal that a copied image corresponding to an original image can be obtained.

2. An image forming apparatus as claimed in claim 1, wherein said sheet feeding condition detecting means detects the trailing end of the latent image forming medium to determine whether the residual quantity of the latent image forming medium becomes zero.

3. An image forming apparatus as claimed in claim 1, wherein the latent image forming medium comprises a photosensitive recording medium.

4. An image forming apparatus as claimed in claim 3, wherein said photosensitive recording medium comprises a microcapsule sheet.

5. An image forming apparatus as claimed in claim 1, wherein said sheet feeding condition detecting means comprises an optical sensor or a lever sensor.

6. An image forming apparatus having an exchangeable cassette having a sheet feed-out side for accommodating a latent image forming medium therein, exposure means for performing an exposure process of exposing the latent image forming medium to light and pressure-developing means for performing a pressure-developing process of contacting the latent image forming medium having the latent image thereon with a visible image forming medium under pressure, thereby to form a visible image on the visible image forming medium, comprising:

sheet feed means for feeding the latent image forming medium to and along a sheet feed path to thereby perform a sheet feeding operation, sheet feeding condition detecting means provided in the vicinity of the sheet feed-out side of the cassette for detecting the latent image forming medium to determine as to whether the latent image forming medium is present or not in the sheet feed path and outputting a detection signal indicative of a detection result; and control means for judging on the basis of the detection signal from said sheet feeding condition detecting means whether or not a sheet feed error occurs, and ceasing the driving of the sheet feeding means when said control means judges the sheet feed error.

7. An image forming apparatus as claimed in claim 6, wherein said feeding condition detecting means detects the leading end of the latent image forming medium to determine whether the sheet feed error occurs.

8. An image forming apparatus as claimed in claim 6, wherein the latent image forming medium comprises a photosensitive recording medium.

9. An image forming apparatus as claimed in claim 8 wherein said photosensitive recording medium comprises a microcapsule sheet.

10. An image forming apparatus as claimed in claim 6, further comprising memory means for storing data on a sheet feeding condition of the latent image forming medium being fed in the sheet feed path, and decision means for determining, after the sheet feeding operation of the latent image forming medium by said feeding means has been ceased by a fault and when the fault is eliminated, whether the sheet feeding operation of the latent image forming medium can be resumed or not based on the data stored in said memory means.

11. An image forming apparatus having an exchangeable cassette having a sheet feed-out side for accommodating a latent image forming medium therein, exposure means for performing an exposure process of exposing the latent image forming medium to light, and pressure-developing means for performing a pressure-developing process of contacting the latent image forming medium having the latent image thereon with a visible image forming medium under pressure, thereby to form a visible image on the visible image forming medium, comprising:

sheet feeding means for feeding the latent image forming medium to and along a sheet feed path to thereby perform a sheet feeding operation;

sheet feeding condition detecting means for monitoring a sheet feeding condition of the latent image forming medium being fed in the sheet feed path and outputting a detection signal indicative of the sheet feeding condition;

memory means for storing data on the sheet feeding condition of the latent image forming medium based on the detection signal; and decision means for determining, after the sheet feeding operation of the latent image forming medium by said feeding means has been ceased by a fault and when the fault is eliminated, whether the sheet feeding operation of the latent image forming medium can be resumed or not based on the data stored in said memory means.

12. An image forming apparatus as claimed in claim 11, wherein said sheet feeding condition means includes an empty sensor for detecting whether the latent image forming medium is present or not.

13. An image forming apparatus as claimed in claim 11, wherein the latent image forming medium comprises a photosensitive recording medium.

14. An image forming apparatus as claimed in claim 13 wherein said photosensitive recording medium comprises a microcapsule sheet.

15. An image forming apparatus as claimed in claim 11, further comprising a display unit for indicating the sheet feeding condition with a two-digit decimal number.

16. An image forming apparatus employing an exchangeable cassette having a sheet feed-out side for accommodating a latent image forming medium therein, exposure means for performing an exposure process of exposing the latent image forming medium to light and pressure-developing means for performing a pressure-developing process of contacting the latent image forming medium having the latent image thereon with a visible image forming medium under pressure, thereby to form a visible image on he visible image forming medium, comprising:

sheet feed means for feeding the latent image forming medium to and along a sheet feed path to thereby perform a sheet feeding operation, sheet feeding condition detecting means provided in the vicinity of the sheet feed-out side of the cassette for detecting the latent image forming medium to determine whether the latent image forming medium is present or not in the sheet feed path and outputting a detection signal indicative of a detection result; and control means for judging on the basis of the detection signal from said sheet feeding condition detecting means whether or not a sheet feed error occurs, and ceasing the driving of the sheet feeding means when said control means judges the sheet feed error; wherein, the detection signal is output from said sheet feeding condition detecting means to said control means at a predetermined time interval.

17. An image forming apparatus having an exchangeable cassette having a sheet feed-out side for accommodating a latent image forming medium therein, exposure means for performing an exposure process of exposing the latent image forming medium light, and pressure-developing means for performing a pressure-developing process of contacting the latent image forming medium having the latent image therein with a visible image forming medium under pressure, thereby to form a visible image on the visible image forming medium, comprising:

sheet feeding means for feeding the latent image forming medium to and along a sheet feed path to thereby perform a sheet feeding operation;

sheet feeding condition detecting means for monitoring a sheet feeding condition of the latent image forming medium being bed in the sheet feed path and outputting a detection signal indicative of the sheet feeding condition;

memory means for storing data on the sheet feeding condition of the latent image forming medium based on the detection signal; and decision means for determining, after the sheet feeding operation of the latent image forming medium by said feeding means has been ceased by a fault and when the fault is eliminated, whether the sheet feeding operation of the latent image forming medium can be resumed or not based on the data stored in said memory means; wherein, said sheet feeding condition means further includes encoder means provided to said sheet feeding means for detecting a sheet feed distance of the latent image forming medium fed in the sheet feed path and a signal indicative of the detected sheet feed amount, and wherein said control means judges on the basis of the signal from said encoder means whether the latent image forming medium is fed along the sheet feed path by a predetermined distance.

* * * * *